United States Patent [19]

Millis et al.

[11] Patent Number: 4,857,430
[45] Date of Patent: Aug. 15, 1989

[54] PROCESS AND SYSTEM FOR DETERMINING PHOTORESIST DEVELOPMENT ENDPOINT BY EFFLUENT ANALYSIS

[75] Inventors: Edwin G. Millis, Dallas; Samuel J. Wood, Jr., Plano, both of Tex.

[73] Assignee: Texas Instruments Incorporated, Dallas, Tex.

[21] Appl. No.: 134,439

[22] Filed: Dec. 17, 1987

[51] Int. Cl.⁴ .............................................. G03C 5/24
[52] U.S. Cl. ...................................... 430/30; 430/311; 430/325; 156/626; 356/436; 356/442; 354/298; 250/573
[58] Field of Search ................. 430/30, 311, 325, 326; 356/436, 441, 442, 443; 354/298, 324; 156/626; 250/573, 574

[56] References Cited

U.S. PATENT DOCUMENTS

| 4,023,193 | 5/1977 | Schroter et al. | 354/298 |
| 4,166,702 | 9/1979 | Okamoto et al. | 356/440 |
| 4,201,579 | 5/1980 | Robinson et al. | 430/323 |
| 4,429,983 | 2/1984 | Cortellino et al. | 354/324 |
| 4,593,986 | 6/1986 | Tomisawa et al. | 354/324 |

FOREIGN PATENT DOCUMENTS

| 57-2042 | 1/1982 | Japan | 430/313 |
| 2041569 | 9/1980 | United Kingdom | 354/324 |

Primary Examiner—Jose G. Dees
Attorney, Agent, or Firm—Joseph E. Rogers; James T. Comfort; Melvin Sharp

[57] ABSTRACT

A system and method for determining the pattern development endpoint of a photoresist polymer during spin/spray processing of a semiconductor wafer utilizes the optical transmission of the waster developer liquid during the pattern develop process to determine when the developing is completed.

11 Claims, 3 Drawing Sheets

PROCESS AND SYSTEM FOR DETERMINING PHOTORESIST DEVELOPMENT ENDPOINT BY EFFLUENT ANALYSIS

FIELD OF THE INVENTION

This invention relates to photoresist development and more particularly to a system and method of detecting the endpoint of photoresist developing where the spectral transmission of the used, or waste developer fluid is monitored during the develop process.

BACKGROUND OF THE INVENTION

As the geometries of integrated circuits get smaller, it is more important that all aspects of processing be controlled. Manufacturing processes have been based on a "recipe" concept, that is, various procedures are followed to produce a desired effect with no exact knowledge of to what is actually occurring on the semiconductor wafer surface.

Rigorous attention to the "recipe" method has allowed semiconductor device manufacturers to progress to the present small feature size patterning, but with the requirement for tighter dimensional control on wafers with ever smaller geometries, the difficulty of controlling all the variables adequately in a particular process becomes far greater. Therefore, instead of attempting to control all the process variables to a high degree of accuracy, it would be much better to determine what constitutes the completion of the process, and use this information to control the ending of the cycle. This "endpoint detection" relieves the system of the requirements of extremely tight control of physical parameters and allows a more tolerant operating range.

Resist patterning techniques employed in the semiconductor lithographic process fundamental to integrated circuit manufacturing usually rely on a fluid dissolution step to remove photoresist polymer either made more soluble or left less resistant to dissolution by selective exposure to some type of photon irradiation or particle bombardment.

It is critically important to control this pattern developing dissolution carefully to achieve close dimensional control of pattern features, the tolerances of which affect yield and practicable design performance limits of semiconductor devices.

Present develop processes employ fixed developing times which are empirically predetermined to achieve the desired pattern dimensions, with every attempt being made to hold substrate, resist, and exposing and developing system parameters fixed at optimum values.

A more effective manufacturing process results when the rate and completion (endpoint) of material removed can be determined as each semiconductor wafer is being processed.

Accurate determination of endpoint can provide a basis for automatic adjustment of total develop time, which is composed of the time required to initially clear resist in the high solubility areas of the pattern plus predetermined additional develop time, for example 50% additional time past initial clearing.

The automatic develop time adjustment can largely compensate, as needed, for patterning process variations in such factors as: exposure system intensity and/or timing mechanism; resist thickness and sensitivity; substrate reflectance; develop solution chemical effectiveness, dispense rate, distribution, and temperature; chamber ventilation; wafer spin speed; and delay between exposure and development.

Monitoring of automatically determined developing times also provides an indication of the degree of control being achieved over the various process parameters and any significant drift of developing time can be used to alert technical personnel.

Monitoring changing thickness of transparent films by interpretation of optical interference occurring between film top and substrate reflections of a beam of monochromatic light is a method which has been effectively used in various material subtractive process in semiconductor fabrication, including resist developing in favorable circumstances.

The effectiveness of optical interference techniques for resist developing endpoint determination can be seriously degraded by processing considerations sometimes encountered in practice. In spin/spray developing processes, the spray can disperse the beam, and extraneous optical interference caused by varying developing fluid film thickness overlying the developing resist can also limit signal quality. Attempts to minimize spray density or fluid film thickness in order to enhance signal quality can degrade develop rate radial and angular uniformity. Low reflectivity of the wafer due to surface texture, transparent film optical interference integral to the semiconductor substrate, or semitransparent film absorption can reduce signal acuity. Also, a pattern with unfavorably low proportion of the resist area designed for removal presents little area changing in thickness such that little signal is obtainable.

Optical interference techniques require that there be optical sensor access over the wafer surface. Optimal sensor positioning may not be available in many present techniques due to the several fluid dispensing fixtures needed in the process.

Polymers employed in the formulation of photoresists typically exhibit high optical transmission at visible and near ultraviolet wavelengths and sharply lower transmission for shorter wavelengths, whereas developer fluids exhibit high transmission throughout this spectrum.

At the very short wavelengths employed in the present invention, optical transmission of the developer fluid is reduced greatly by even very low proportions of dissolved photoresist polymer. At intermediate ultraviolet wavelengths, greater proportions of dissolved polymer are required to cause sufficient absorption to greatly reduce optical transmission, such that sensitivity of the technique may be substantially affected by the wavelength chosen for analysis.

Experiment has shown that this high sensitivity to polymer presence of very short wavelength transmission can be employed to effectively analyze photoresist develop process effluent as a means of real-time monitoring of photoresist dissolution rate.

SUMMARY OF THE INVENTION

The present invention is an effluent analysis method and the apparatus is used in determining the endpoint of photoresist develop on semiconductor wafers. A steeply-sloped drain bowl is used to receive the developer solution as it drains from the surface of a semiconductor wafer during the spin/spray develop procedure. The vapor exhaust from the process chamber is limited during the developing time to minimize evaporation loss and uncontrolled cooling of the developer during the process.

Connected to the drain bowl is a short drain hose of minimal diameter to connect the drain bowl with an analysis chamber. The analysis chamber is designed to have a minimum volume consistent with the volume of developer fluid available and needed for analysis of the resist content. The analysis chamber has a small diameter but is long relative to the diameter to maximize the optical path length used in the optical analysis of the "used" developer.

A hydrostatic drain trap is used with the analysis chamber and is fitted with a siphon-suction break to ensure a full sample for analysis without interfering with drainage.

Upon completion of the developing process, a rinse with higher fluid flow rate occurs. To overcome any limiting effect of the fluid analysis chamber a dual path drain system may be used.

During the develop process, the photoresist polymer content is monitored in the used developer, and when the polymer content decreases to an essentially constant level, it may be determined that the developing process is at or near its end point.

Provisions are included in the present invention to frequently recalibrate the optical analyzer system with regard to; illuminator and filter actinic output; spectral sensitivity of the photodetector; photodetector amplifier gain; analog-to-digital conversion; and possible accumulation on wetted surfaces of the lamp and lens of material deposited from solution. Changes in any of the foregoing would introduce error into the optical transmission analysis if not canceled or compensated for.

Recalibration is accomplished during the rinse phase of each wafer develop cycle as the analysis cell is thoroughly flushed with fluid of high and stable optical transmission (water, in present processing). The system control computer resets the monitored transmission calibration to 100% at this time. If a reasonably high value of the measured transmission is not obtained, process technicians are alerted by the system control computer.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
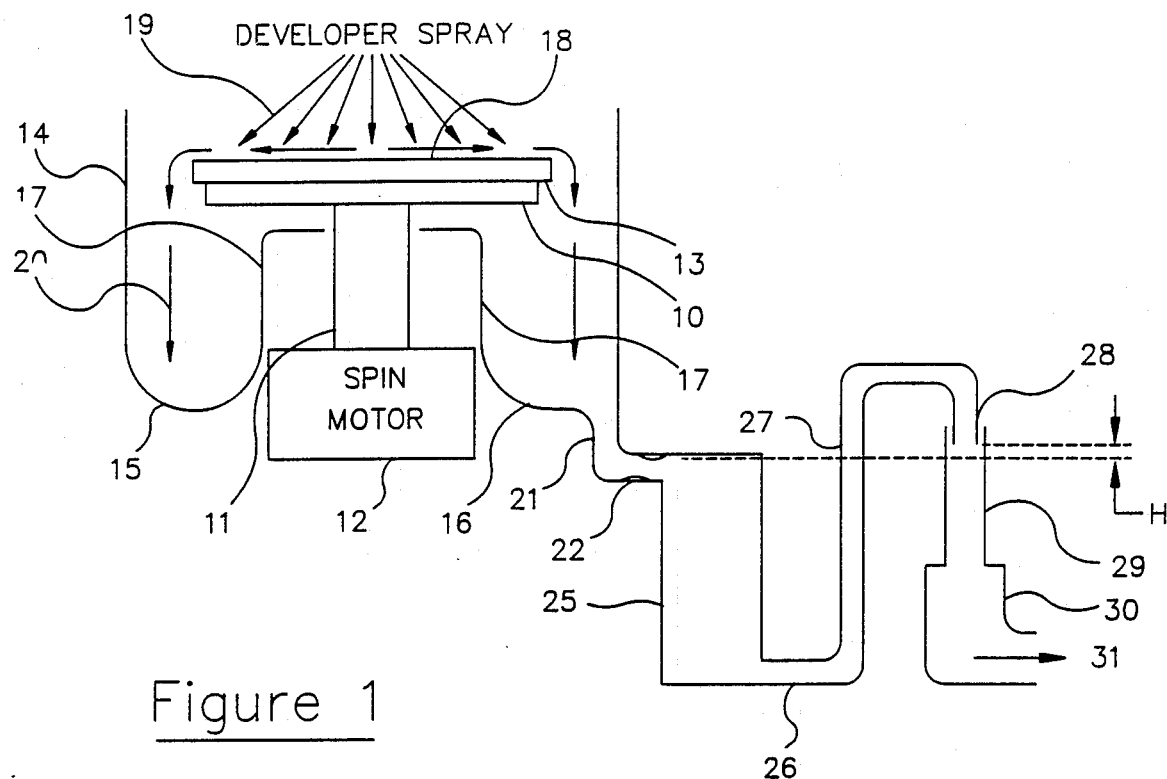
FIG. 1 illustrates the system of the present invention.

FIG. 1 illustrates a pictorial representation of the apparatus characteristic of the present invention. The apparatus is used to spin-develop photoresist polymer on a semiconductor wafer and incorporates additional apparatus used for determining the endpoint of photoresist pattern development on the semiconductor wafer.

A steeply-sloped drain bowl 14 is used to receive the developer solution as it drains from the surface of a semiconductor wafer 13 during the spin/spray develop procedure. The vapor exhaust from the process chamber is limited during the developing time to minimize evaporation loss and uncontrolled cooling of the developer during the process.

Semiconductor wafer 13 is mounted on a vacuum chuck 10 that is turned by a spin motor 12. Developer fluid 19 is sprayed onto the surface 18 of the semiconductor wafer 13 as it is rotated by spin motor 12. The developer fluid 19, while on the surface 18 of the semiconductor wafer 13, dissolves photoresist polymer and is spun off the wafer in drops 20, and falls into the drain bowl 14, flowing to the bottom 15 and 16 of the drain bowl. Photoresist polymer-laden developer is drained from the drain bowl into an analysis chamber 25. Connected to the drain bowl is a short drain hose 21 of minimal diameter to connect the drain bowl with the analysis chamber 25.

The analysis chamber 25 is designed to have a minimum volume consistent with the volume of developer fluid available and needed for analysis of the resist content. The analysis chamber has a small diameter but is long relative to the diameter to maximize the optical path length used in the optical analysis of the used or waste developer.

A hydrostatic drain trap 27,28 is used with the analysis chamber and is fitted with a siphon-suction break h to ensure a full sample for analysis without interfering with drainage. Below the siphon suction break are exhaust and drain tubes 29 and 30 which drain away analyzed fluid as shown at 31.

Upon completion of the developing process a rinse with higher fluid flow rate occurs. To overcome any limiting effect of the fluid analysis chamber, a dual path drain system (not illustrated) may be used.

During the develop process, the photoresist polymer content in the used developer is monitored, and when the polymer content decreases to an essentially constant level amount, then it may be determined that the developing process is at or near its end point.

Figure 2:
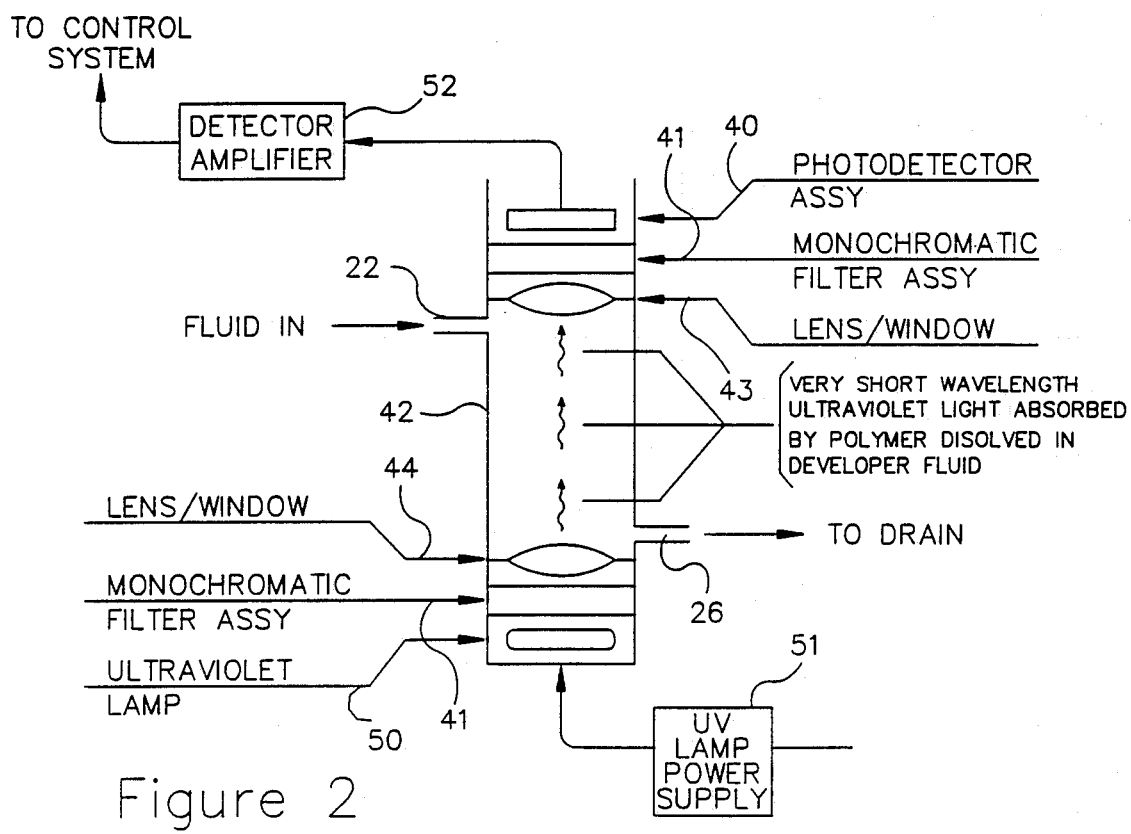
FIG. 2 illustrates a photo analysis cell of the present invention.

The analysis chamber is shown conceptually in FIG. 2. The photoresist-laden developer flows into the analysis chamber through the drain tube 22, downward through the analysis tube 42 and out the exit tube 26. On the lower end of the analysis tube 42 is an ultraviolet lamp 50 and power source 51, lens 44 and monochromatic filter assembly 41 which is used to direct a beam of light of a desired wavelength through the developer fluid. A monochromatic filter 41 may be employed at either or both ends of the analysis tube.

The beam of light, which is a very short wavelength ultraviolet light, is absorbed by polymer dissolved in the developer fluid and represented by arrows 45, travels through the developer and impinges upon a photosensor 40 through a lens 43 and monochromatic filter assembly 44.

The output of the photodetector is amplified in detector amplifier 52 before it is sent to a control system computer. The percent of light reaching the photo sensor during endpoint analysis is compared with the amount of light reaching the photo sensor with only pure developer fluid introduced into the analysis tube 42. As the photoresist polymer content of the developer increases, the amount of light transmitted through the developer decreases. The endpoint of the development process is determined by a comparison of the optical transmission analysis of the developer in its pure state with that of the developer fluid having varying amounts of dissolved photoresist introduced by the develop process.

Figure 3:
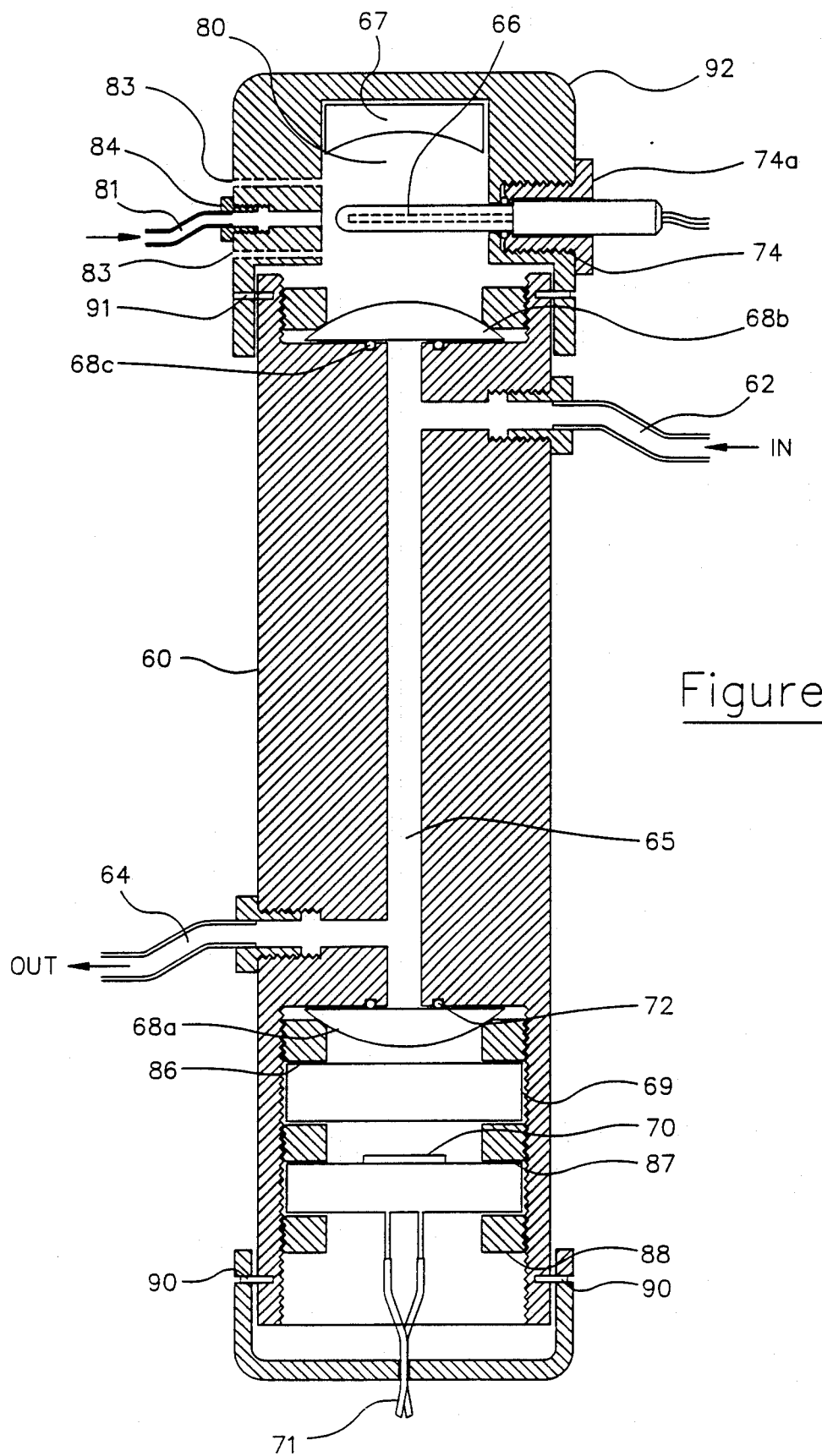
FIG. 3 illustrates a photodetector cell that may be used as the photo analysis cell of FIG. 2.

FIG. 3 illustrates construction details of a sensor which may be used as the analysis chamber of the present invention. The sensor has a housing 60 adapted to permit the flow of developer fluid or other chemical whose optical properties are to be measured. The developer is introduced into the body of the sensor at the input 62, attached by fitting 62a, and flows into the sensor housing into a narrow fluid chamber 65, and out at the output port 64 and fitting 64a.

A low-pressure mercury-argon lamp 66 is mounted at one end of the housing 60 through an opening in lamp housing end cap 92. Lamp chamber 80, in which the lamp end is enclosed, is sealed by the lamp 66, an O-ring 74, and threaded packing nut 74a.

The lamp end of the housing 60 is separated from the fluid chamber 65 by lens 68b and O-ring 68C, which also prevents fluid from flowing into the lamp chamber 80.

Added illumination is provided by mirror 67 mounted on the end of the housing to reflect back light from the lamp through the lens 68b. Lamp chamber 80 is filled with nitrogen to cool the lamp and to exclude ozone-forming oxygen, and is introduced through input 81 which is attached to the housing by fitting 84. Nitrogen is vented out of the lamp chamber through vents 83.

On the end of the sensor housing opposite the lamp end is a photo detector 70 and filter 69. The photodetector/filter chamber is sealed from the fluid chamber 65 by a quartz lens 68a and an O-ring 72. The lens is used to focus the light from the lamp on to the photodetector.

The detector may be optimally sensitive in the 254 nm wavelength range. A 254 nm wave length dielectric interference filter 69 is use to filter the light from the lamp to pass light only of 254 nm wavelength. The output 71 of the detector depends upon the amount of photoresist polymer dissolved in the developer that is flowing through the sensor.

The lens 68a, filter 69 and photodetector are held in place by ring nuts 86, 87 and 88 which are threaded and shaped to hold each respective part in place, but permit the assembly or removal of the parts as may be needed. End cap 89 covers the end of the housing and is held in place by pins 90. In a similar manner the lamp end/housing 92 is held in place by pins 91.

In order to service and clean the analysis chamber and associated parts, the end caps 89 and 92 may be removed to clean the lens 68a and 68b to remove any accumulated deposits on the lens.

Figure 4:
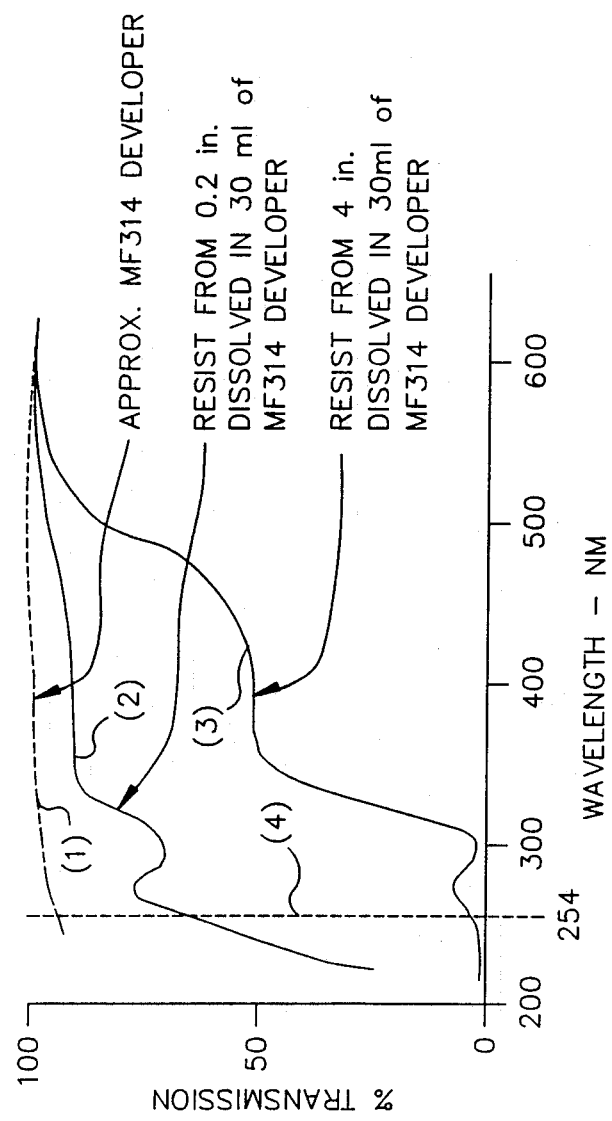
FIG. 4 is a graph illustrating the optical properties of a developer fluid with various amounts of photoresist polymer dissolved therein.

The relationship between the transmission properties of the polymer-laden developer and the wavelength of the light impinging on the detector is illustrated in FIG. 4.

FIG. 4 illustrates the optical properties of a photoresist developer, for example, the developer manufactured by Shipley Corp. and designated MF314. The graph in FIG. 4 is a comparison of the wavelength of light (x-axis) plotted against the percent of light transmission (y-axis) of the developer at different light wavelengths for; (1) the pure developer, (2) an amount of photoresist polymer from a 0.2 sq. in. layer dissolved in 30 ml of MF314 developer, and (3) an amount of photoresist polymer from a 4 sq. in. layer dissolved in 30 ml of MF314 developer.

Also illustrated is a vertical line (4) representative of a 254 nm beam of light. These curves indicate that there is a correlation between the amount of dissolved polymer in the developer and light transmission in the vicinity of 254 nm. The three curves also show a correlation in the transmission properties of the developer based on a particular wavelength of light, and the amount of polymer dissolved in the developer.

For example, it may be seen that the percent of transmission reduces from about 50% when 20 ml of developer has resist dissolved in it from a 0.2 sq. in. area to nearly 0% when 30 ml of developer has resist dissolved from a 4 sq. in. area.

A process of optical transmission analysis is disclosed and claimed in copending patent application Ser. No. 134,438, filed 12/17/87 and entitled SENSOR FOR DETERMINING PHOTORESIST DEVELOPER STRENGTH.

What is claimed:

1. In a method of developing patterned photoresist polymer on a semiconductor wafer and detecting the endpoint of the develop process, the steps of spraying developer fluid onto a semiconductor wafer mounted and spinning on a spinning vacuum chuck, catching the developer fluid as it is spun from the surface of the semiconductor wafer, draining the developer fluid into an analysis chamber, analyzing the developer fluid for the amount of dissolved photoresist polymer therein, and rinsing the semiconductor wafer to remove developer fluid therefrom when the detected amount of dissolved photoresist polymer in the developer fluid reaches a predetermined amount.

2. The method according to claim 1, wherein the analysis chamber measures the amount of photoresist polymer in the developer fluid by monitoring the ultraviolet light transparency of the developer fluid, which transparency is dependent upon the amount of photoresist polymer dissolved in the developer fluid.

3. The method according to claim 2, wherein said analysis chamber measures the transparency of the developer fluid by directing a beam of filtered light through the developer fluid to a photodetector, the amount of light from the beam reaching the photodetector being indicative of the transparency of the developer fluid.

4. The method according to claim 3, wherein a reference value is used in determining the ultraviolet light transparency of the developer fluid, said reference being the transparency of developer fluid that has no photoresist polymer dissolved therein.

5. The method according to claim 1, wherein the developer fluid drains at the rate of at least 1-3 milliliter per second.

6. In a method of developing patterned photoresist polymer on a semiconductor wafer and detecting the endpoint of the develop process, the steps of spraying developer fluid onto a semiconductor wafer mounted and spinning on a spinning vacuum chuck, catching the developer fluid in a steeply-sloped drain bowl as it is spun from the surface of the semiconductor wafer, draining the developer fluid from the drain bowl into an analysis chamber, analyzing the developer fluid for the amount of dissolved photoresist polymer therein, and rinsing the semiconductor wafer to remove developer fluid therefrom when the detected amount of dissolved photoresist polymer in the developer fluid reaches a predetermined amount.

7. The method according to claim 6, wherein the analysis chamber measures the changing amount of photoresist polymer in the developer fluid by monitoring the ultraviolet light transparency of the developer fluid, which transparency is dependent upon the amount of photoresist polymer dissolved in the developer fluid.

8. The method according to claim 7, wherein said analysis chamber measures the ultraviolet light transparency of the developer fluid by directing a beam of light through the developer fluid to a photodetector, the amount of light from the beam reaching the photodetector being indicative of the transparency of the developer fluid.

9. The method according to claim 8, wherein a reference value is used in determining the transparency of the developer fluid, said reference being the transparency of developer fluid that has no photoresist polymer dissolved therein.

10. The method according to claim 6, wherein the developer fluid is analyzed in the analysis chamber to determine the rate of change of the photoresist polymer in the developer fluid.

11. The method according to claim 10, wherein the endpoint of the develop process of the photoresist polymer on the semiconductor wafer is reached when the fluid transmission recovers substantially and the rate of change of the photoresist polymer in the developer fluid approaches zero.

* * * * *